(12) United States Patent
Rahman

(10) Patent No.: US 7,989,959 B1
(45) Date of Patent: Aug. 2, 2011

(54) METHOD OF FORMING STACKED-DIE INTEGRATED CIRCUIT

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 213 days.

(21) Appl. No.: 12/361,827

(22) Filed: Jan. 29, 2009

(51) Int. Cl.
H01L 23/42 (2006.01)
H01L 21/44 (2006.01)

(52) U.S. Cl. ........ 257/777; 257/686; 257/774; 257/778; 257/E23.145; 438/108; 438/109

(58) Field of Classification Search .................. 257/777, 257/686, 774, E23.145; 438/108, 109
See application file for complete search history.

(56) References Cited

U.S. PATENT DOCUMENTS

| | | | |
|---|---|---|---|
| 5,399,898 A * | 3/1995 | Rostoker | 257/499 |
| 5,682,062 A * | 10/1997 | Gaul | 257/686 |
| 5,917,709 A | 6/1999 | Johnson et al. | |
| 5,995,379 A * | 11/1999 | Kyougoku et al. | 361/803 |
| 6,150,724 A | 11/2000 | Wenzel et al. | |
| 6,577,013 B1 * | 6/2003 | Glenn et al. | 257/777 |
| 6,882,045 B2 | 4/2005 | Massingill et al. | |
| 6,903,443 B2 * | 6/2005 | Farnworth et al. | 257/621 |
| 7,068,072 B2 | 6/2006 | New et al. | |
| 7,276,799 B2 * | 10/2007 | Lee et al. | 257/777 |
| 7,323,771 B2 | 1/2008 | Fujita et al. | |
| 7,367,503 B2 | 5/2008 | Harai et al. | |
| 7,412,668 B1 | 8/2008 | Duong | |
| 7,435,910 B2 | 10/2008 | Sakamoto et al. | |
| 7,466,028 B1 | 12/2008 | Yu et al. | |
| 7,518,398 B1 | 4/2009 | Rahman et al. | |
| 7,538,033 B2 | 5/2009 | Trezza | |
| 7,557,367 B2 | 7/2009 | Rogers et al. | |
| 7,605,458 B1 | 10/2009 | Rahman et al. | |
| 7,619,441 B1 | 11/2009 | Rahman et al. | |
| 7,765,686 B2 | 8/2010 | Murakami et al. | |
| 7,838,997 B2 | 11/2010 | Trezza | |
| 2002/0139577 A1 * | 10/2002 | Miller | 174/261 |
| 2004/0061238 A1 * | 4/2004 | Sekine | 257/774 |
| 2008/0150088 A1 | 6/2008 | Reed et al. | |
| 2009/0020855 A1 | 1/2009 | Pyeon | |
| 2009/0230552 A1 | 9/2009 | Pendse | |
| 2009/0319968 A1 | 12/2009 | Wang et al. | |
| 2009/0321947 A1 * | 12/2009 | Pratt | 257/777 |
| 2010/0270597 A1 | 10/2010 | Sproch et al. | |
| 2010/0289124 A1 | 11/2010 | Nuzzo et al. | |
| 2011/0018573 A1 | 1/2011 | Hamada et al. | |
| 2011/0036396 A1 | 2/2011 | Javaraman et al. | |

OTHER PUBLICATIONS

U.S. Appl. No. 11/701,807, filed Feb. 1, 2007, Rahman et al.
U.S. Appl. No. 11/973,062, filed Oct. 4, 2007, Rahman et al.
U.S. Appl. No. 12/041,612, filed Mar. 3, 2008, Rahman et al.
U.S. Appl. No. 12/392,065, filed Feb. 24, 2009, Rahman.
U.S. Appl. No. 12/361,115, filed Jan. 28, 2009, Rahman.

* cited by examiner

*Primary Examiner* — Nitin Parekh
(74) *Attorney, Agent, or Firm* — Michael Hardaway; LeRoy D. Maunu

(57) ABSTRACT

A stacked-die integrated circuit and a method of fabricating same. The stacked-die integrated circuit has circuitry formed in the first surface of a mother die, a plurality of through-die vias with at least one through-die via providing electrical connection between the circuitry of the mother die and the second surface and a plurality of contact pads formed in the second surface of the semiconductor die for mounting a daughter die wherein some of the contact pads are electrically isolated dummy pads.

15 Claims, 5 Drawing Sheets

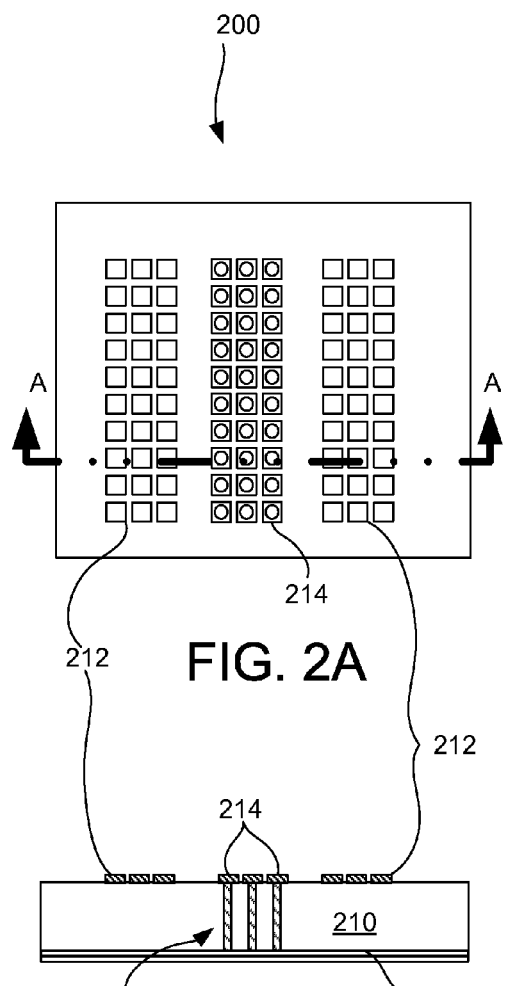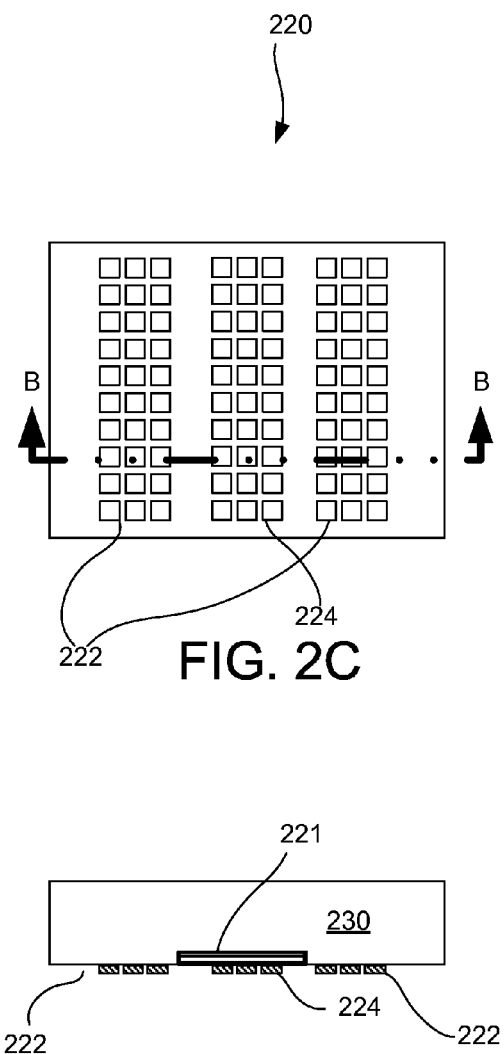
FIG. 2A
FIG. 2B
(SEC. A-A)
FIG. 2C
FIG. 2D
(SEC. B-B)

(SEC. C-C)

METHOD OF FORMING STACKED-DIE INTEGRATED CIRCUIT

FIELD OF THE INVENTION

The present application relates generally to integrated circuits, and in particular, to a stacked-die integrated circuit device package and methods of forming the same.

BACKGROUND OF THE INVENTION

Modern integrated circuit devices continue to shrink in size as they accelerate in speed. More and more functionality is demanded of less and less device "real estate" or available circuit space, whether on the printed circuit board of an electronic appliance or on the semiconductor chip in which integrated circuits are formed.

Existing integrated circuits are essentially two-dimensional in that they are formed on the surface of flat semiconductor wafers. Until the advent of the stacked-die assembly, notwithstanding the development of limited multi-layer circuitry, the only ways to increase the complexity of a circuit were to increase the area of semiconductor used or to shrink feature size.

Stacked die technology has taken semiconductor fabrication into the third dimension, allowing a potentially large number of stacked dice to put very complex devices into small appliance footprints. The additional advantage of thin wafer technology combines to put very complex circuitry in the same footprint as a single die.

Stacking dice, though, brings new challenges. Stacking requires that a daughter die be attached to a mother die, typically by an array of solder bumps, and requires that the mother die have contactable points on both top and bottom surfaces of the chip. A daughter die typically has fewer total connection points to its circuitry than does the mother die, resulting in a smaller array of contact pads and solder bumps than the mother die. Often, this means that the connection between mother and daughter, though electrically sound, is insufficiently robust mechanically. This complicates the handling and processing of the mother/daughter assembly during packaging and other processing.

SUMMARY OF THE INVENTION

Embodiments of the present invention provide stacked-die integrated circuits that are mechanically as well as electrically sound when assembled. Embodiments disclosed in this Application enable the fabrication of relatively robust stacked die assemblies using thin and fragile semiconductor wafers. The methods disclosed allow for a daughter die to be stacked on a mother die with electrically connected contact pads as well as electrically isolated dummy contact pads. The dummy contact pads provide mechanical and thermal connection and protection to the mother-daughter assembly.

Disclosed herein is a stacked-die integrated circuit and a method of fabricating the same. The stacked-die integrated circuit has circuitry formed in the first surface of a semiconductor mother die, a plurality of through-die vias with at least one through-die via providing electrical connection between the circuitry of the mother die and the second surface and a plurality of contact pads formed in the second surface of the mother die for mounting a daughter die wherein some of the contact pads are electrically isolated dummy pads.

In one embodiment, the stacked-die integrated circuit is mounted to a packaging substrate that provides connectivity between the integrated circuit and the outside environment. This allows the entire package to be mechanically robust without alteration of mother die and daughter die circuitry.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings:

FIG. 2A illustrates a semiconductor mother die and its contact pad array in accordance with an embodiment of the present invention;

FIG. 2B illustrates a cross-section of a semiconductor mother die in accordance with an embodiment of the present invention;

FIG. 2C illustrates a semiconductor daughter die and its contact pad array in accordance with an embodiment of the present invention;

FIG. 2D illustrates a cross-section of a semiconductor daughter die in accordance with an embodiment of the present invention;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
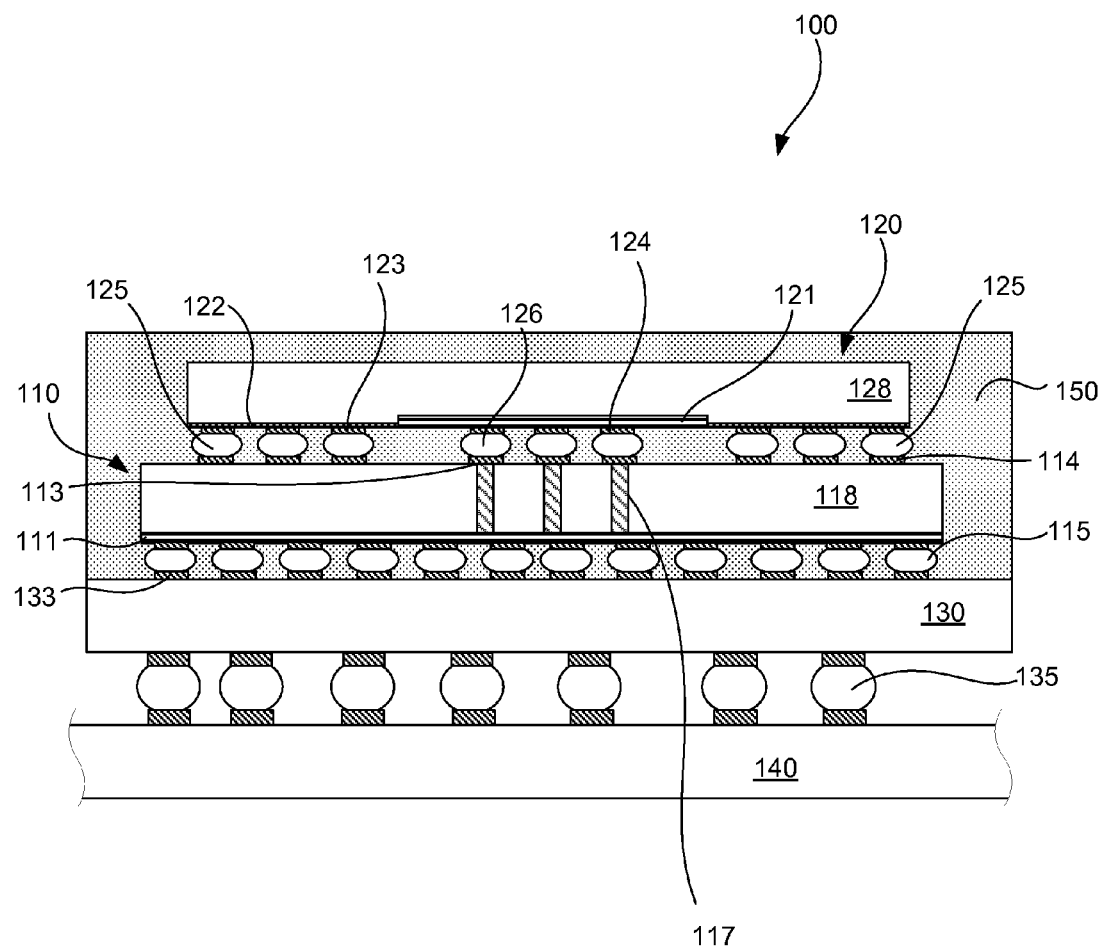
FIG. 1 illustrates a packaged and mounted stacked-die semiconductor device in accordance with an embodiment of the present invention.

FIG. 1 illustrates a packaged and mounted stacked-die semiconductor device in accordance with an embodiment of the present invention. Semiconductor device 100 comprises mother die 110, daughter die 120, and package substrate 130. The assembly is typically encapsulated in a packaging material 150. The packaging material is typically an epoxy or other thermosetting material that provides electrical insulation for the semiconductor device, often with heat sinking capability.

Semiconductor device 100 is, in the embodiment shown, mounted to printed circuit board 140 by means of solder ball grid array (BGA) 135. Ball grid array 135, along with the associated substrate and printed circuit board contact pads, provides electrical and mechanical connectivity between the semiconductor device 100 and the external environment. Typically, solder balls in ball grid arrays are arrayed on a pitch of between 200 µm and 250 µm, though some ball grid arrays have had pitches outside that range.

A contact pad is formed in the semiconductor material of a substrate and its associated solder bump or solder ball is later applied to it. Because the solder and the contact pad are bonded thermally, electrically, and mechanically, they become in essence a single entity. Hence, there is interchangeability of the terms solder ball and solder bump in that there is consistency and similarity of their function when discussing layout pitch or connectivity. It is also noted that one significant difference between a solder ball and a solder bump is the size difference which is indicated in the scale of the array pitch.

It should also be noted that the packaging material, in addition to covering and insulating the semiconductor die assembly, can also include under-fill material that occupies the spaces between the mother and daughter dice and between the mother die and package substrate, as well as between the solder bumps. The under-fill material may enter these spaces, in some embodiments, by capillary action before setting and hardening.

Mother die 110, mounted to package substrate 130 by solder bump array 115, comprises a semiconductor substrate 118, typically silicon, which provides a base for integrated circuitry 111 that is formed on the face, or bottom surface, of the die. Through-die vias 117 are formed in the silicon to provide electrical conductivity between the circuitry 111 and back, or upper surface, contact pads 113. In the embodiment shown, there are also electrically isolated contact pads 114 on the back of mother die 110. These electrically isolated contact pads 114 provide mechanical and thermal connectivity between mother die 110 and daughter die 120.

Daughter die 120 comprises a semiconductor substrate 128 that provides the base for daughter die integrated circuitry 121. The face of daughter die 120 is typically populated with an array of contact pads 124 coupled to integrated circuitry 121. In an embodiment of the present invention, there is also an array of contact pads 123 which are isolated from integrated circuitry 121. In one embodiment, contact pads 123 are bonded to daughter die ground plane 122 while maintaining their isolation from the integrated circuitry 121. Contact pads 123 and 124 provide the contact base for solder bumps 125 and 126, respectively. Solder bumps of daughter die solder bumps 126 coupled to the integrated circuitry 121. Solder bumps 124 provide electrical connection between the integrated circuitry of daughter die 120 and the integrated circuitry of mother die 110. In an embodiment of the present invention, solder bumps 125 provide mechanical and thermal connectivity between mother and daughter dice but do not provide electrical connectivity.

The solder bumps connecting the daughter die to the mother die, and connecting the mother die to the package substrate are typically arrayed on a pitch in the range of 20 µm to 30 µm, though some embodiments are formed on other pitch distances. In an embodiment of the present invention, electrically isolated solder bumps 125 are arrayed on a denser pitch in order to provide a stronger thermal bond between daughter die 120 and mother die 110.

It is noted here that a primary heat removal path of a semiconductor device is through the back/upper surface of the die. In a stacked-die assembly, heat removal from the mother die is altered by the presence of the daughter die. In an embodiment of the present invention, the electrically isolated solder bumps are bonded to power or ground planes of the daughter die in order to improve heat conduction away from the mother die. By forming these isolated solder bumps at a denser pitch, the heat conductivity is increased further, producing improved thermal protection of mother die 110.

FIGS. 2A and 2B illustrate a semiconductor mother die and its contact pad array in accordance with an embodiment of the present invention. FIG. 2A shows the contact pad arrays 212 and 214 on the back/upper surface of mother die 200 in plan form. FIG. 2B shows cross section AA of mother die 200.

In FIGS. 2A and 2B, contact pad array 214 is shown as being connected to an array of through-die vias 217. Through-die via array 217 provides connectivity between the contact pads 214 mother die circuitry 211. Also shown are contact pad arrays 212. In this embodiment, the contact pads of contact pad arrays 212 are shown as not electrically connected to any circuitry in the mother die 200. However, contact pad arrays 212 are mechanically and thermally bonded to the silicon substrate 210 of mother die 200. In this embodiment, the contact pad pitch is the same for both contact pad array 214 and arrays 212. In another embodiment, the non-connected contact pads of contact pad array 212 are formed on a finer pitch.

FIGS. 2C and 2D illustrate a semiconductor device daughter die 220 and its arrays of contact pads 222 and 224. The contact pads of array 224 are intended to be electrically coupled, when assembled, to the mother die contact pads of mother die array 214. The electrically isolated contact pads of contact pad arrays 222 of daughter die 220 are intended to be mechanically and thermally coupled to the isolated contact pads of mother die contact pad arrays 212. When coupled via solder bumps, the isolated contact pads of arrays 212 and 222 provide thermal and mechanical connectivity with electrical connectivity.

In section BB of FIG. 2D, the contact pads of array 224 are shown as being connected to daughter die integrated circuitry 221. The contact pads of arrays 222, though, are not connected electrically to the integrated circuitry 221 of daughter die 220. However, in an embodiment, the contact pads of arrays 222 are mechanically and thermally bonded to daughter die substrate 230. In another embodiment of the present invention, the contact pads of arrays 222 are electrically and thermally bonded to a metal ground plane or power plane in the substrate 230. By being coupled to a metal layer in the daughter die, the contact pads provide thermal conductivity better than that of contact pads bonded directly to semiconductor material.

FIG. 2D shows daughter die 220 in cross section BB. In the embodiment shown, daughter die integrated circuitry 221 occupies a smaller part of the available footprint of daughter die 220, enabling isolated, or dummy, contact pads 222 to be directly bonded to semiconductor substrate 230. This illustration is not meant to depict an actual size relationship between substrate 230 and circuitry 221 but to show the isolated nature of contact pads 222. Other embodiments enable the placement of isolated dummy contact pads directly over the integrated circuitry and isolated by at least an insulation layer.

It is noted here that forming an isolated contact pad bonded to semiconductor material can result in a height difference between a solder bump formed on an isolated contact pad and a solder bump formed on an electrically connected contact pad. To avoid this height mismatch, some embodiments of the present invention form isolated contact pads through passivation openings and bond them to either a power plane or a ground plane. This bonding can produce the thermal conductivity enhancement discussed above.

Figure 3A:
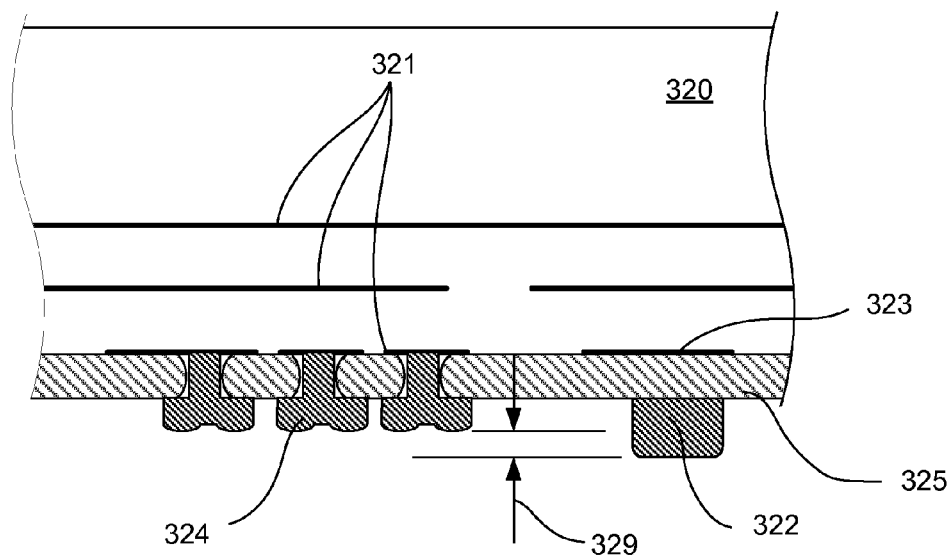
FIG. 3A illustrates a cross-section of a daughter die contact pad connection in accordance with an embodiment of the present invention.

FIG. 3A illustrates a cross-section of a daughter die contact pad connection in accordance with an embodiment of the present invention. Here a cross section of a daughter die 320 is used to illustrate an embodiment. Electrically coupled, or live, contact pads 324 are shown here as being formed over holes etched through passivation layer 325 and allowing deposition of the contact pad material, typically metal, to contact and bond to the appropriate portions of daughter die integrated circuit 321. In this embodiment, dummy contact pad 322, formed in the same fabrication step as electrically coupled contact pads 324, is formed on passivation layer 325, making no contact with ground plane 323. Because the process step deposits the same amount of material for both live contact pads 324 and dummy contact pads 322, the material subsiding into the hole in the passivation layer causes a subsidence of the contact pad. This results in a height mismatch 329 between live contact pads 324 and dummy contact pads 322.

It should be noted here that a height mismatch can, in some instances, result in an insufficient bond between electrically connected contact pads. It can also result in a mechanically weak or strained union between mother and daughter dice.

In one embodiment of the present invention, height mismatches are avoided by etching a hole in the passivation under each contact pad, both live and dummy. The subsidence of pad material is then the same for both live and dummy pads. This results in a similar height between the two types of pads.

Figure 3B:
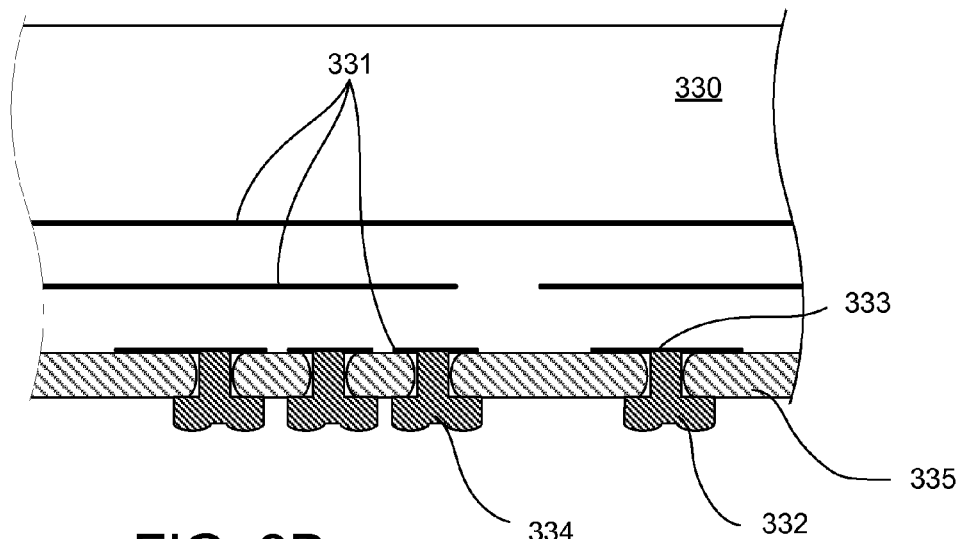
FIG. 3B illustrates a cross-section of a daughter die contact pad connection in accordance with an embodiment of the present invention.

This embodiment is illustrated in FIG. 3B where daughter die 330 is shown as having all its contact pads, both live and dummy, at the same height. Live contact pads 334 are formed over holes in passivation 335 allowing contact with elements of integrated circuit 331. Dummy contact pad 332 is also formed over a hole in the passivation 335, here allowing contact with, and bonding to, ground plane 333. In this case, dummy pad 332 is not electrically isolated but is electrically coupled with ground plane 333. In an alternative embodiment, dummy pad 332 is coupled to a power plane. In yet another embodiment, dummy pad 332 is coupled to a signal trace in the integrated circuitry. This connection does not cause problems because the opposing pad in the mother die is not connected to any electrically coupled plane. Once again, an added benefit of bonding a dummy pad to a metal layer in the semiconductor die is enhancement of heat transfer.

It is noted that the use of a daughter die in FIGS. 3A and 3B is for illustration of the concepts of various embodiments. The concepts presented in these figures apply to mother dice as well as to other integrated circuit implementations.

Figure 4A:
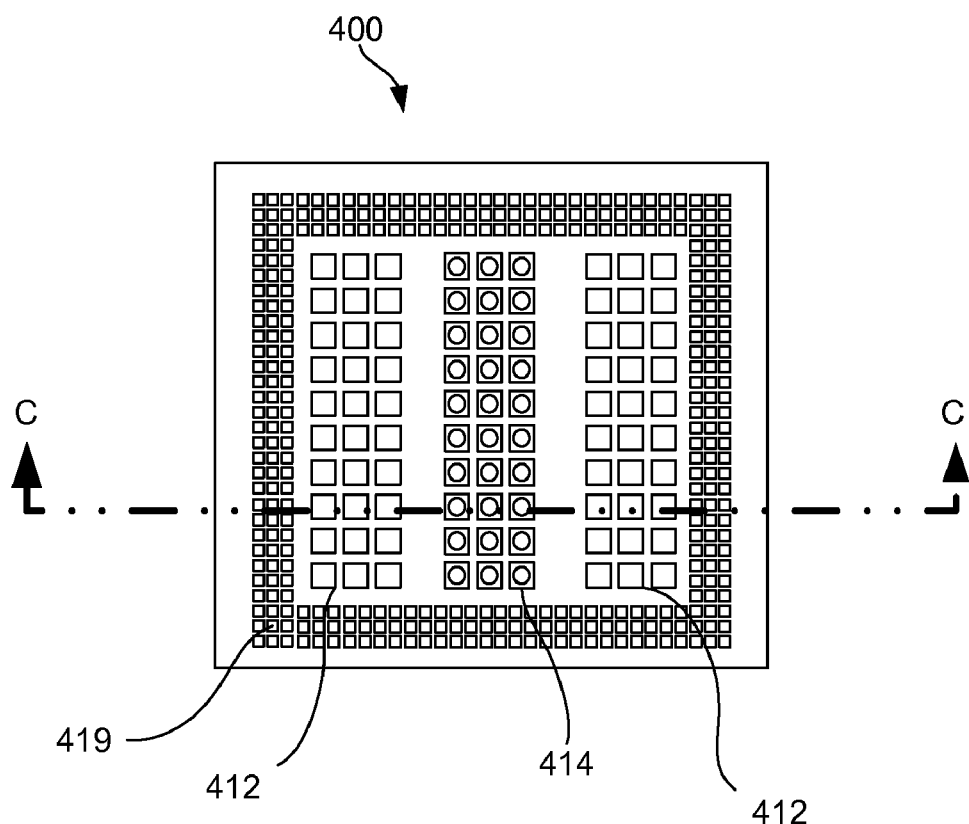
FIG. 4A illustrates an alternative embodiment of a mother die having contact pads of different pitches in accordance with an embodiment of the present invention.
Figure 4B:
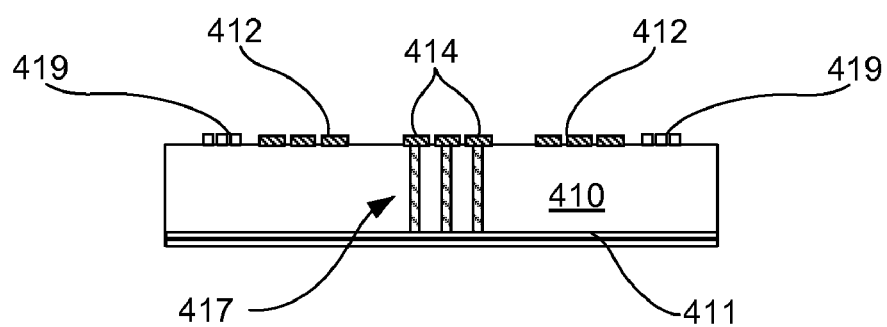
FIG. 4B illustrates a cross section of a mother die having contact pads of different pitches in accordance with an embodiment of the present invention.

FIGS. 4A and 4B illustrate an alternative embodiment of a mother die having contact pad arrays formed at different layout pitches. In FIG. 4A, a plan form view of a mother die 400 is shown. In FIG. 4B, cross section CC illustrates the components of mother die 400. Mother die 400 has integrated circuitry 411 formed in the face of substrate 410. Through-die vias 417 connect the integrated circuitry 411 to contact pads 414 on the back of substrate 410. In addition to connected contact pads 414, the back surface of substrate 410 also holds dummy contact pads 412 and 419.

Each of the arrays of contact pads 412, 414 and 419 are enabled to be formed at a different contact pad pitch, also referred to herein as solder bump pitch. The pitch of electrically connected contact pad array 414 is, in an embodiment, determined by the pitch of the underlying through-die vias 417. Dummy contact pads 412 are not limited by through-die via pitch and can be formed at a denser pitch if required for mechanical robustness or thermal conductivity. However, in one embodiment, the pitch of contact pad array 412 is the same as that for contact pad array 414 in order to mate with a specific family of daughter dice. For this illustration, the family of daughter dice can employ many identical process steps while forming different integrated circuits. In this scenario, the process step forming the daughter die contact pads. Dummy contact pads 419 are shown at a denser pitch than either contact pads 412 or 414. Here, dummy contact pads 419 exist only for mechanical and thermal reasons, as outlined above.

Figure 5:
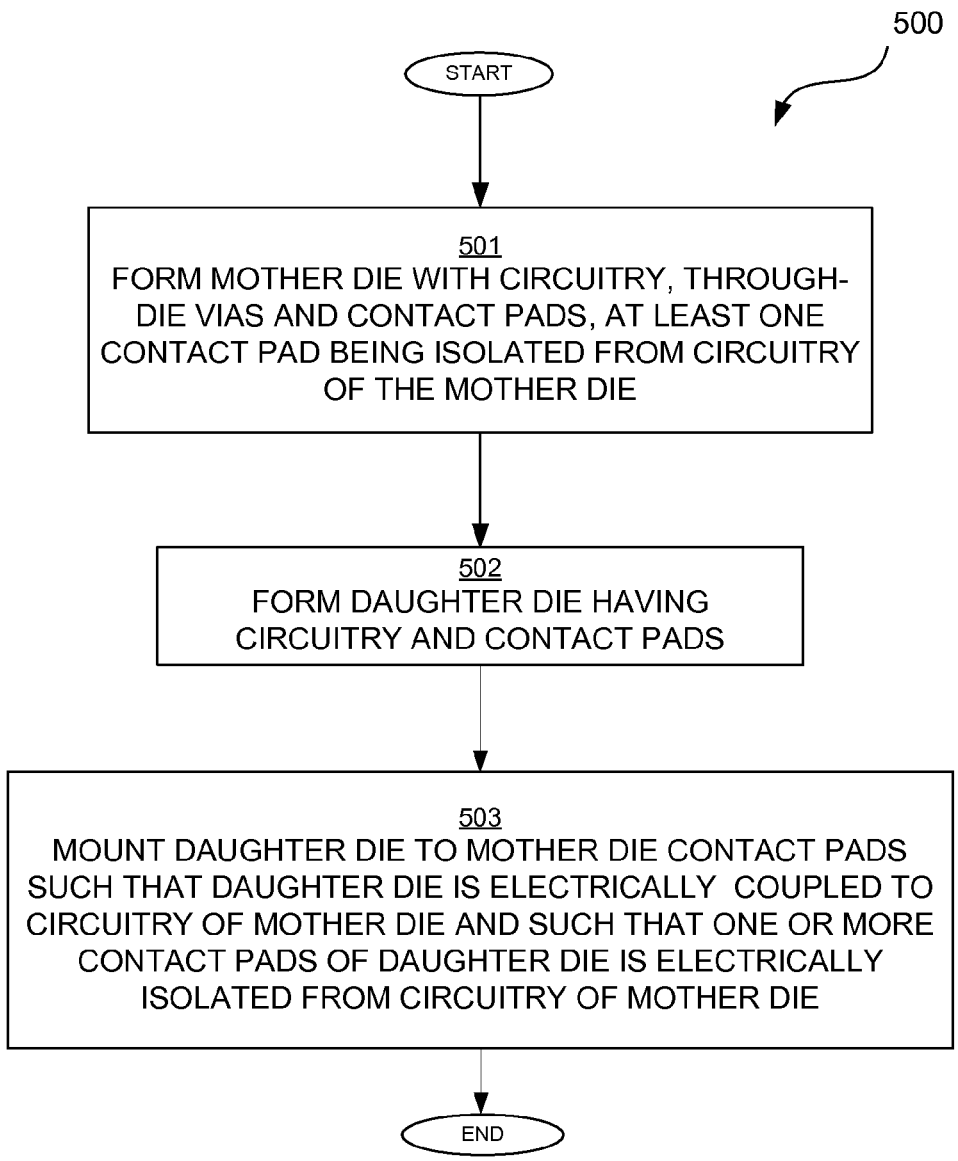
FIG. 5 is a flow chart illustrating a method of fabricating a stacked-die integrated circuit in accordance with an embodiment of the present invention.

FIG. 5 is a flow illustrating the formation of a stacked die assembly employing various embodiments of the present invention. Here, process 500 starts by forming 501 a mother die having integrated circuitry in a substrate with through-die vias connecting parts of the circuitry to contact pads on the back of the mother die. The mother die also has contact pads on the back surface that are not connected to through-die vias, these dummy contact pads being electrically floating, and isolated from the circuitry.

Process 500 continues with the formation 502 of a daughter die having integrated circuitry and also having contact pads that mate to solder bumps that connect to contact pads on the back of the mother die formed at 501. The array or arrays of contact pads on the face of the daughter die may or may not have the same pitch but they do have the same pitch as their respective counterpart contact pads on the back of the mother die.

At step 503, the daughter die is mounted the mother die by means of solder bumps on the corresponding contact pads. The mounting results in the integrated circuitry of the daughter die being electrically coupled to the integrated circuitry of the mother die. The mounting also results in one or more of the contact pad pairs of the mother die/daughter die combination, with their associated solder bump, being electrically isolated from integrated circuitry.

It is noted here that embodiments of the present invention can apply equally well the mounting of multiple daughter dice to the back of a mother die. Having a plurality of small daughter dice on a larger mother die makes more evident the need for a mechanically robust mounting.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit device, comprising:
   a first die having circuitry formed in a first surface;
   a plurality of through-die vias formed in the first die, at least one through-die via of the plurality of through-die vias providing electrical connection between the circuitry of the first die and a second surface of the first die;
   a first plurality of contact pads formed in the second surface of the first die; and
   a second die mounted on the first die, the second die having circuitry and a second plurality of contact pads that are soldered to corresponding ones of the first plurality of contact pads;
   wherein first contact pads of the first plurality of contact pads and the corresponding contact pads of the second plurality of contact pads provide electrical connection between the circuitry of the first die and the circuitry of the second die by means of a through-die via; and wherein second contact pads of the first plurality of contact pads and the corresponding contact pads of the second plurality of contact pads are electrically isolated from the circuitry of the first die and electrically isolated from the circuitry of the second die.

2. The integrated circuit device of claim 1 wherein the second contact pads of the first plurality of contact pads are formed with the same pitch and height as the first contact pads of the first plurality of contact pads.

3. The integrated circuit device of claim 1 wherein the of the first plurality of contact pads contact pads of the first plurality of contact pads are formed with a finer pitch than the first contact pads of the first plurality of contact pads.

4. The integrated circuit device of claim 3 wherein the pitch of the first plurality of contact pads and the pitch of the second plurality of contact pads are is enabled to accommodate capillary flow of an under fill material.

5. An integrated circuit device, comprising:
   a semiconductor mother die comprising circuitry formed in a first surface and a first plurality of contact pads formed in a second surface, at least one of the first plurality of contact pads being electrically connected to the circuitry by means of a through-die via and at least one of the first plurality of contact pads being electrically isolated from the circuitry;
   a daughter die mounted to the mother die and comprising circuitry and a second plurality of contact pads;
   an array of solder bumps bonding the second plurality of contact pads of the daughter die to the corresponding contact pads of the first plurality of contact pads of the mother die;
   wherein the at least one contact pad of the first plurality of contact pads that is electrically isolated from the circuitry of the mother die and the corresponding contact pad of the second plurality of contact pads is electrically isolated from the circuitry of the mother die and electrically isolated from the circuitry of the daughter die.

6. The integrated circuit device of claim 5, further comprising under fill material disposed in spaces between the mother die and the daughter die.

7. The integrated circuit device of claim 5 wherein the at least one contact pad of the first plurality of contact pads that is electrically isolated from the circuitry of the mother die is connected to a blind through-die via.

8. The integrated circuit device of claim 5 further comprising a packaging substrate mounted to contact pads on the first surface of the mother die.

9. The integrated circuit device of claim 8 further comprising packaging material disposed to provide electrical insulation and mechanical protection for the electrically connected mother die, daughter die and packaging substrate.

10. A method of fabricating a stacked-die integrated circuit device, comprising:
    forming a semiconductor mother die, wherein the mother die comprises circuitry and a first plurality of contact pads, at least one contact pad of the first plurality of contact pads being electrically connected to the circuitry by means of a through-die via and at least one contact pad of the first plurality of contact pads being electrically isolated from the circuitry of the mother die;
    forming a semiconductor daughter die, wherein the daughter die comprises circuitry and a second plurality of contact pads; and
    mounting the daughter die to the mother die with an array of solder bumps bonding the second plurality of contact pads of the daughter die to the corresponding contact pads of the first plurality of contact pads of the mother die such that the circuitry of the daughter die is electrically coupled to the circuitry of the mother die;
    wherein the at least one contact pad of the first plurality of contact pads that is electrically isolated from the circuitry of the mother die and the corresponding contact pad of the second plurality of contact pads is electrically isolated from the circuitry of the mother die and electrically isolated from the circuitry of the daughter die.

11. The method of claim 10 wherein the mounting of the daughter die further results in the daughter die and the mother die being mechanically coupled to each other.

12. The method of claim 10 further comprising underfilling the daughter die with a thermosetting packaging material.

13. The method of claim 12 wherein the underfilling provides thermal and mechanical protection to the integrated circuit device.

14. The method of claim 10 wherein the daughter die is of a plurality of daughter dice, each daughter die of the plurality of daughter dice being mounted to the back surface of a mother die.

15. The method of claim 10 wherein the integrated circuit device is a field programmable gate array.

* * * * *